(12) United States Patent  
Chen (10) Patent No.: US 6,963,112 B2
(45) Date of Patent: Nov. 8, 2005

(54) ELECTROSTATIC DISCHARGE PROTECTION CIRCUIT WITH A DIODE STRING

(75) Inventor: Chung-Hui Chen, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 70 days.

(21) Appl. No.: 10/754,770

(22) Filed: Jan. 9, 2004

(65) Prior Publication Data

US 2005/0151200 A1   Jul. 14, 2005

(51) Int. Cl.[7] .............................................. H01L 29/76
(52) U.S. Cl. ...................... 257/365; 257/365; 257/357
(58) Field of Search ................................ 257/355, 357, 257/358, 360

(56) References Cited

U.S. PATENT DOCUMENTS 5,239,440 A  *  8/1993  Merrill ......................... 361/56
5,568,346 A  * 10/1996  Orchard-Webb ............. 361/58

OTHER PUBLICATIONS

Ker, Ming-Dou et al., "Capacictor-Couple ESD Protection Circuit for Deep-Submicron Low-Voltage CMOS ASIC", IEEE Transactions on Very Large Scale Integration (VLSI) Systems, vol. 4, No. 3, (Sep. 1996), pp. 307-321.

Ker, Ming-Dou et al., "Complementary-SCR ESD Protection Circuit with Interdigitated Finger-Type Layout for Input Pads of Submicron CMOS IC'S", IEEE Transactions in Electron Devices, vol. 42, No. 7, (Jul. 1995), pp. 1297-1304.

Wu et al., A New On-Chip ESD Protection Circuit with Dual Parasitic SCR Structures for CMOS VLSI, IEEE Journal of Solid-State Circuits, vol. 27, No. 3, (Mar. 1992), pp. 274-280.

* cited by examiner

Primary Examiner—David Nelms
Assistant Examiner—Thinh T Nguyen
(74) Attorney, Agent, or Firm—Duane Morris LLP (57) ABSTRACT

An electrostatic discharge (ESD) protection circuit is disclosed for preventing a pad-to-pad ESD charge. The protection circuit for each pad of an integrated circuit comprises a current dissipation module with an N-type MOSFET connected in parallel with a bipolar junction transistor (BJT) wherein the drain of the MOSFET and the collector of the BJT are connected to a first common node and the source of the MOSFET and the emitter of the BJT are connected to a second common node connectable to a second operating voltage. A diode string is connected to a first pad at its anode end having a total forward voltage drop more than a first operating voltage and with its cathode end connected to the body of the MOSFET, the base of the BJT, and to the second common node through a resistor.

15 Claims, 5 Drawing Sheets

ELECTROSTATIC DISCHARGE PROTECTION CIRCUIT WITH A DIODE STRING

BACKGROUND OF THE DISCLOSURE

The present disclosure relates generally to integrated circuit (IC) design, and more particularly to a method for protecting the core circuitry of an integrated circuit (IC) from damage that may be caused by electrostatic discharge (ESD). A gate oxide of any metal-oxide-semiconductor (MOS) transistor, in an integrated circuit, is most susceptible to damage. The gate oxide may be destroyed by being contacted with a voltage only a few volts higher than operating voltage. It is understood that a regular operating voltage is 5.0, 3.3, 3.1 volts, or lower. Electrostatic voltages from common environmental sources can easily reach thousands, or even tens of thousands of volts. Such voltages are destructive even though the charge and any resulting current are extremely small. So, it is of critical importance to discharge any static electric charge, as it builds up, before it accumulates to a damaging voltage.

ESD is only a concern to an integrated circuit before it is installed into larger circuit assembly, such as a printed circuit board (PCB), and before the PCB is connected to an operating power. This susceptible period includes production, storage, transport, handling, and installation. After the power is supplied, the power supplies and the structures can easily absorb or dissipate electrostatic charges.

ESD protection circuitry is typically added to ICs at the bond pads. The pads are the connections to the IC, to or from outside circuitry, for all electric power supplies, electric grounds, and electronic signals. Such added circuitry must allow normal operation of the IC. That means that the protection circuitry is effectively isolated from the normally operating core circuitry because it blocks current flow through itself to ground or any other circuit or pad. In an operating IC, electric power is supplied to a VCC pad, electric ground is supplied to a VSS pad, electronic signals are supplied from outside to some pads, and electronic signals generated by the core circuitry of the IC are supplied to other pads for delivery to external circuits and devices. In an isolated, unconnected, IC, all pads are considered to be electrically floating, or of indeterminant voltage. In most cases, that means that the pads are at ground, or zero voltage.

ESD can arrive at any pad. This can happen, for example, when a person touches some of the pads on the IC. This is the same static electricity that may be painfully experienced by a person who walks across a carpet on a dry day and then touches a grounded metal object. In an isolated IC, ESD acts as a brief power supply for one or more pads, while the other pads remain floating, or grounded. Because the other pads are grounded, when ESD acts as a power supply at a randomly selected pad, the protection circuitry acts differently than it does when the IC is operating normally. When an ESD event occurs, the protection circuitry must quickly become current conductive so that the electrostatic charge is conducted to VSS ground and thus dissipated before damaging voltage builds up.

ESD protection circuitry, therefore, has two states. In a normally operating IC, ESD protection circuitry appears invisible to the IC by blocking current through itself and thus having no effect on the IC. In an isolated, unconnected IC, ESD protection circuitry serves its purpose of protecting the IC by conducting an electrostatic charge quickly to VSS ground before a damaging voltage can build up. What is needed is an improved ESD protection circuit.

SUMMARY OF THE DISCLOSURE

An electrostatic discharge (ESD) protection circuit is disclosed for preventing a pad-to-pad ESD charge. The protection circuit for each pad of an integrated circuit comprises a current dissipation module with an N-type MOSFET connected in parallel with a bipolar junction transistor (BJT) wherein the drain of the MOSFET and the collector of the BJT are connected to a first common node and the source of the MOSFET and the emitter of the BJT are connected to a second common node connectable to a second operating voltage. A diode string is connected to a first pad at its anode end having a total forward voltage drop more than a first operating voltage and with its cathode end connected to the body of the MOSFET, the base of the BJT, and to the second common node through a resistor. When the ESD charge causes a voltage on the first pad to surpass the total forward voltage drop of the diode string, the ESD charge injects a direct current to the base of the BJT so as to enhance the dissipation of the ESD charge and wherein the diode string keeps the voltage on the first pad between the first and second operating voltages.

Various aspects and advantages will become apparent from the following detailed description, taken in conjunction with the accompanying drawings, illustrating by way of example the principles of the disclosure.

DETAILED DESCRIPTION

The present disclosure provides an IC with an ESD protection circuitry that is inert during normal operation of the IC and active when the IC is unconnected. The ESD protection circuitry acts, by means of a diode string, to clamp a positive ESD charge on a bondpad to a voltage just above an operating voltage VDD and to switch on a parallel combination of an N-channel metal-oxide-semiconductor field-effect-transistor (NMOSFET) and a bipolar transistor to dissipate the charge harmlessly. The bipolar transistor may be parasitic or constructed. The drive for the dissipating transistors lowers the threshold voltage and the snapback voltage. Two examples of the application of the diode string are presented.

Figure 1A:
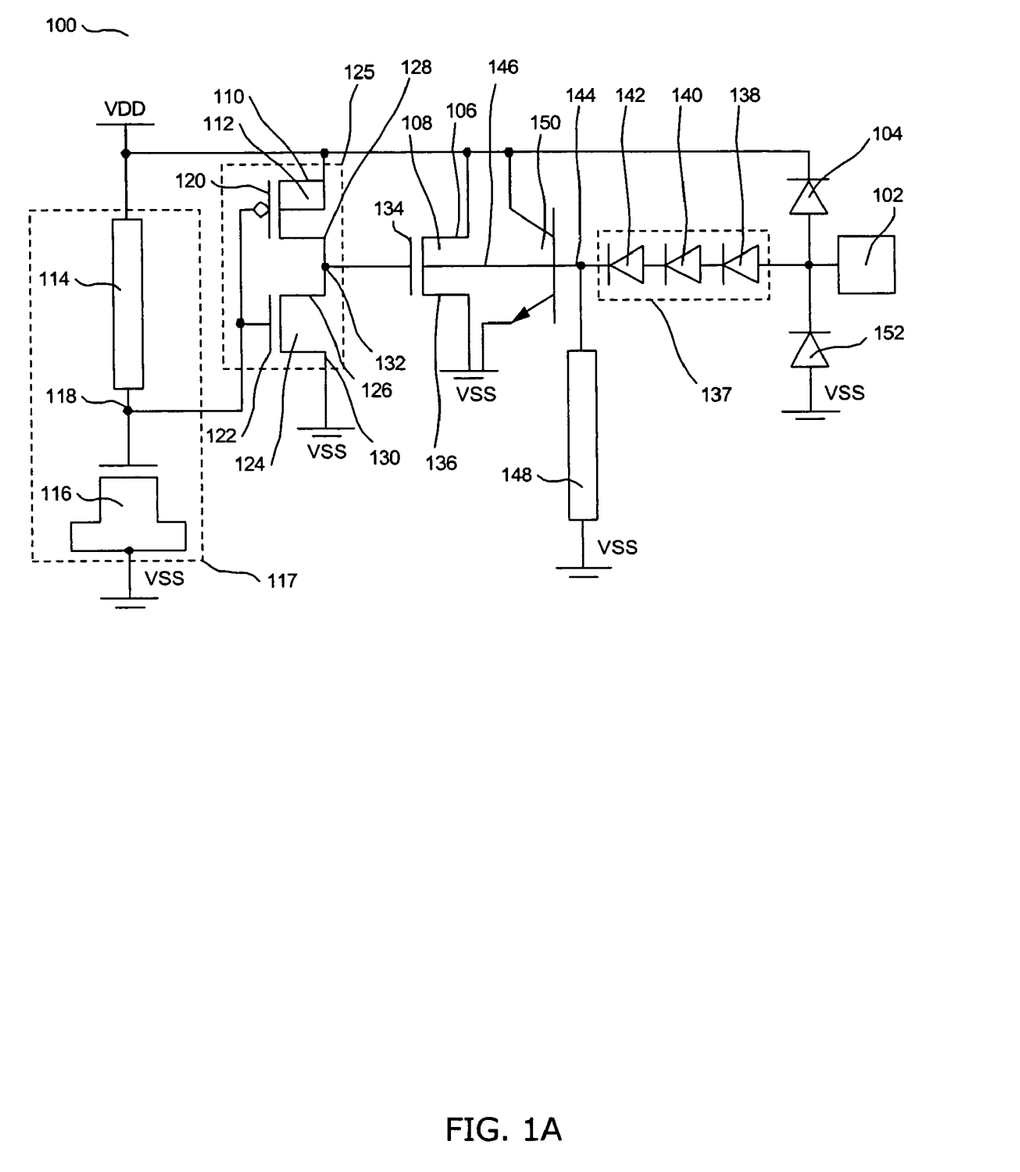
FIG. 1A illustrates an electrostatic discharge protection circuitry in accordance with a first example of the present disclosure.

In a first example, as illustrated in FIG. 1A, an electrostatic discharge (ESD) protection circuit 100 is connected to a bondpad, or pad 102, of an integrated circuit (IC). In a typical circuit, such a pad may be connected to an external electric power supply VDD, an external electric ground VSS, an external electronic input signal source, or an internal electronic output signal source. Here, VDD is shown to be supplied internally from another source, and VSS is shown to be supplied internally to five locations from another source. The IC is susceptible to electrostatic discharge damage before it is installed into a larger circuit assembly, such as a printed circuit board (PCB), and before the PCB is connected to operating power. This susceptible period includes production, storage, transport, handling, and installation. ESD protection circuitry is connected to each pad. In an isolated, unconnected IC, all pads are considered to be at ground or VSS voltage level.

The anode of a diode 104 is connected to pad 102. The cathode of diode 104 is connected to the drain 106 of an N-channel metal-oxide-semiconductor field-effect-transistor (NMOSFET) 108, to the source 110 of a P-channel metal-oxide-semiconductor field-effect-transistor (PMOSFET) 112, and to VDD. A resistor 114 is connected between VDD and an NMOS capacitor 116 to form a RC module 117. The other side of NMOS capacitor 116 is connected to VSS. A connection runs from a node 118 between the resistor 114 and the NMOS capacitor 116 to the gate 120 of PMOSFET 112 and to the gate 122 of an NMOSFET 124. Together, PMOSFET 112 and NMOSFET 124 form a complementary MOS (CMOS) inverter 125, with the drain 126 of NMOSFET 124 connected to the source 128 of PMOSFET 112 and the source 130 of NMOSFET 124 connected to VSS. From a node 132 between PMOSFET 112 and NMOSFET 124, a connection runs to the gate 134 of NMOSFET 108. The source 136 of NMOSFET 108 is connected to VSS. Pad 102 is also connected to a diode string 137 having a plurality of diodes connected in series. For example, the cathode of diode 138 is connected to the anode of a diode 140, the cathode of diode 140 is connected to the anode of a diode 142, and the cathode of diode 142 is connected to a node 144 and to the body 146 of NMOSFET 108. Three diodes are shown in the string as one example, but there can be any number of diodes connected in series as long as the diode string serves the purpose of clamping the ESD. A resistor 148 is connected between the cathode of diode 142 and VSS. A bipolar transistor 150 is connected in parallel with NMOS 108 so that the emitter, base, and collector of bipolar transistor 150 are connected respectively to source 136, body 146, and drain 106 of NMOSFET 108. The bipolar function can be performed by either an inherent parasitic bipolar transistor or an actual bipolar transistor constructed by any well-known technology. In addition, the cathode of a diode 152 is connected to pad 102, and the anode is connected to VSS.

In operation, pad 102 is a part of an IC such as a VDD, VSS, or an input or an output pin that varies in a voltage range between VDD and VSS. Since the voltage at pad 102 does not rise above VDD or fall below VSS, diode 104, connected between pad 102 and VDD, and diode 152, connected between pad 102 and VSS, do not conduct. After starting up the IC, node 118 is charged to VDD and no current flows through resistor 114. So, voltage VDD is delivered to the gate 120 of PMOSFET 112 and the gate 122 of NMOSFET 124 in the inverter. Therefore, VSS is delivered to the gate 134 of NMOSFET 108, and NMOSFET 108 is always turned off. Body 146 may receive influence from the pad 102 through the diode string 137. The diode count is chosen such that the sum of the forward voltage drops across all the diodes is just larger than VDD. The minimum number of diodes necessary is selected such that the protection function will commence before any damage occurs. Therefore, no signal from the pad within the normal voltage range between VDD and VSS reaches the body 146 of NMOSFET 108, and NMOSFET 108 remains off at all times in normal operation. NMOSFET 108 is designed to conduct electrostatic charges to ground VSS when challenged by a positive ESD. However, in normal operation, both the gate 134 input and the body 146 input hold NMOSFET 108 securely off so that it has no effect on the normal operation of the IC.

When a positive ESD arrives at a randomly selected pad 102, the ESD acts as a power supply applying positive voltage to that pad. When the voltage suddenly begins to rise at pad 102, current flows through diode 104 as the voltage rises above the forward voltage drop of diode 104 and that current begins to charge the drain 106 of NMOSFET 108, the source 110 of PMOSFET 112, and the node that is VDD in normal operation. Current begins to flow through resistor 114 so that the voltage at node 118 begins to rise. As node 118 is still at a relatively low value, the inverter output voltage at node 132 is nearly as high as the drain 106 of NMOSFET 108. So NMOSFET 108 is driven into conduction almost immediately, and the ESD charge starts to dissipate through NMOSFET 108 to VSS. Also, as the ESD voltage at pad 102 rises above VDD, the voltage almost immediately surpasses the sum of the forward drops of the diode string and current begins to flow through the diode string 137 to the body of NMOSFET 108 and through resistor 148 to VSS. The current through resistor 148 builds a voltage at node 144, which sustains the current into the body 146 of NMOSFET 108. That current into the body of NMOSFET 108 acts as a base current for bipolar transistor 150. Therefore, bipolar transistor 150 is also driven into conduction almost immediately, conducting a current $I_{ce}$, which is a multiple (beta) of the base current. This is effective whether this is the inherent parasitic bipolar transistor or an actual constructed bipolar transistor. This adds to the dissipation of the ESD charge to VSS. Now, both NMOSFET 108 and bipolar transistor 150 are dissipating static charge. This continues until the voltage at node 118 reaches a switching threshold of the inverter 125. Then the inverter switches off NMOSFET 108. If ESD voltage is still rising at pad 102, then the current is still supplied through the diode string 137 to drive bipolar transistor 150, which continues to dissipate any remaining ESD charge to VSS so that the voltage at pad 102 remains clamped at or below the sum of the forward diode voltage drops of the diode string. The ESD charge is thus dissipated to VSS while the voltage at pad 102 is clamped to a value, only slightly above VDD, which is safe for the core circuitry of the IC. In short, the ESD charge dissipates from pad 102 through diode 104 and through the parallel combination of NMOS 108 and bipolar transistor 150 through VSS to ground.

Figure 1B:
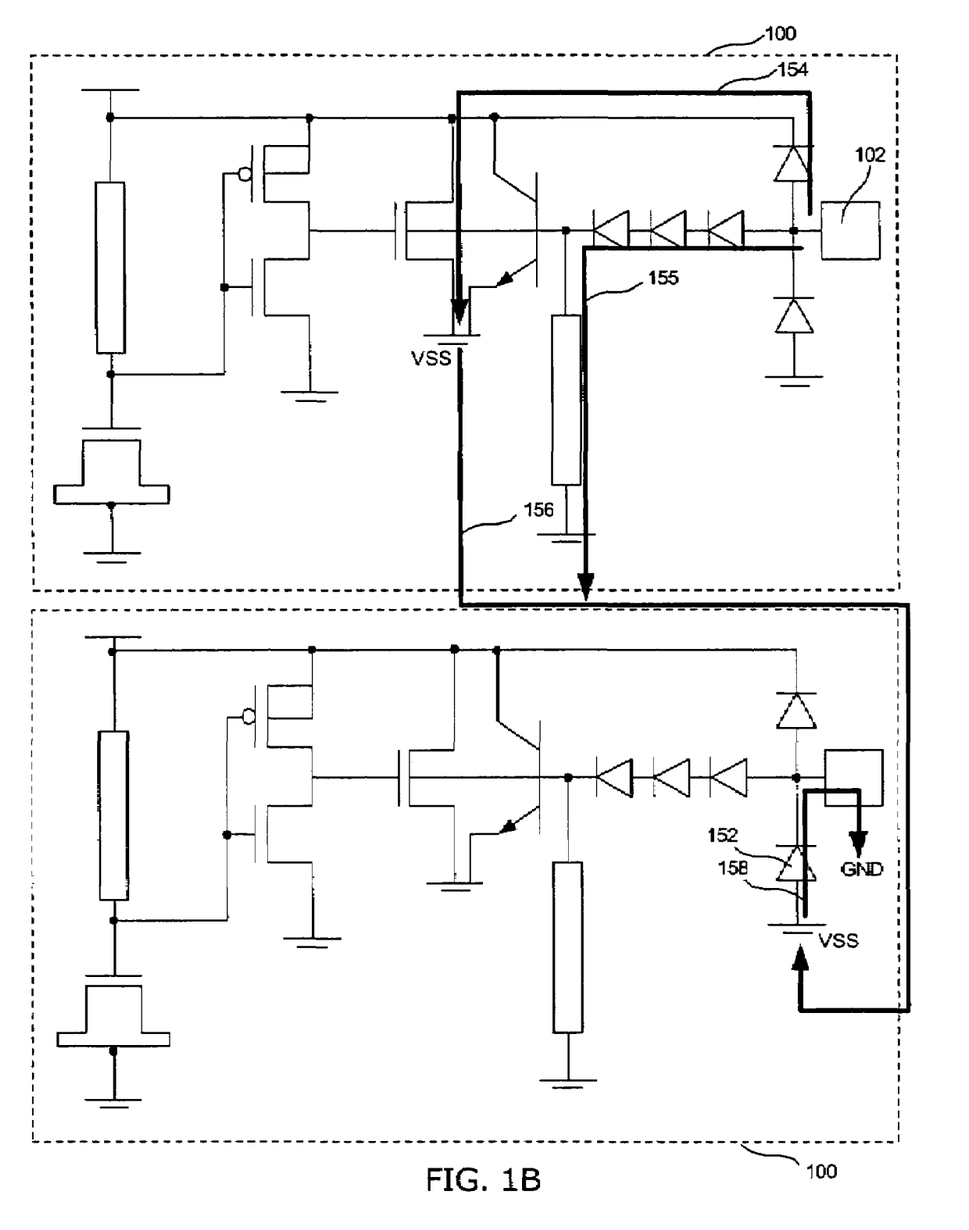
FIG. 1B illustrates an example of electric current pathway in accordance with the first example of the present disclosure.

FIG. 1B illustrates electric current pathways when a positive ESD arrives at the pad 102 in accordance with the first example of the present disclosure. With reference to both FIGS. 1A and 1B, FIG. 1B includes two ESD protection circuits 100, the top circuit of which is zapped by a positive ESD. The pad of the bottom circuit is connected to ground. If the pad of the top circuit is not connected to ground, the ESD charge is first dissipated to a VSS connection of the top circuit, as represented by pathways 154 and 155. Since the VSS connection of the top circuit is commonly connected, as represented by a common connection 156, to a VSS connection of the bottom circuit, whose pad is connected to ground, the ESD charge will travel from the VSS connections of the top circuit to the VSS of the bottom circuit. The ESD charge then travels through a pathway 158 via the diode 152 before it is finally dissipated through ground.

When a negative ESD arrives at the randomly selected pad 102, the negative voltage can only build up to the forward voltage drop across diode 152. Negative static charge is dissipated at this low voltage to VSS through diode 152. The core circuitry of the IC is thus easily protected.

Figure 2:
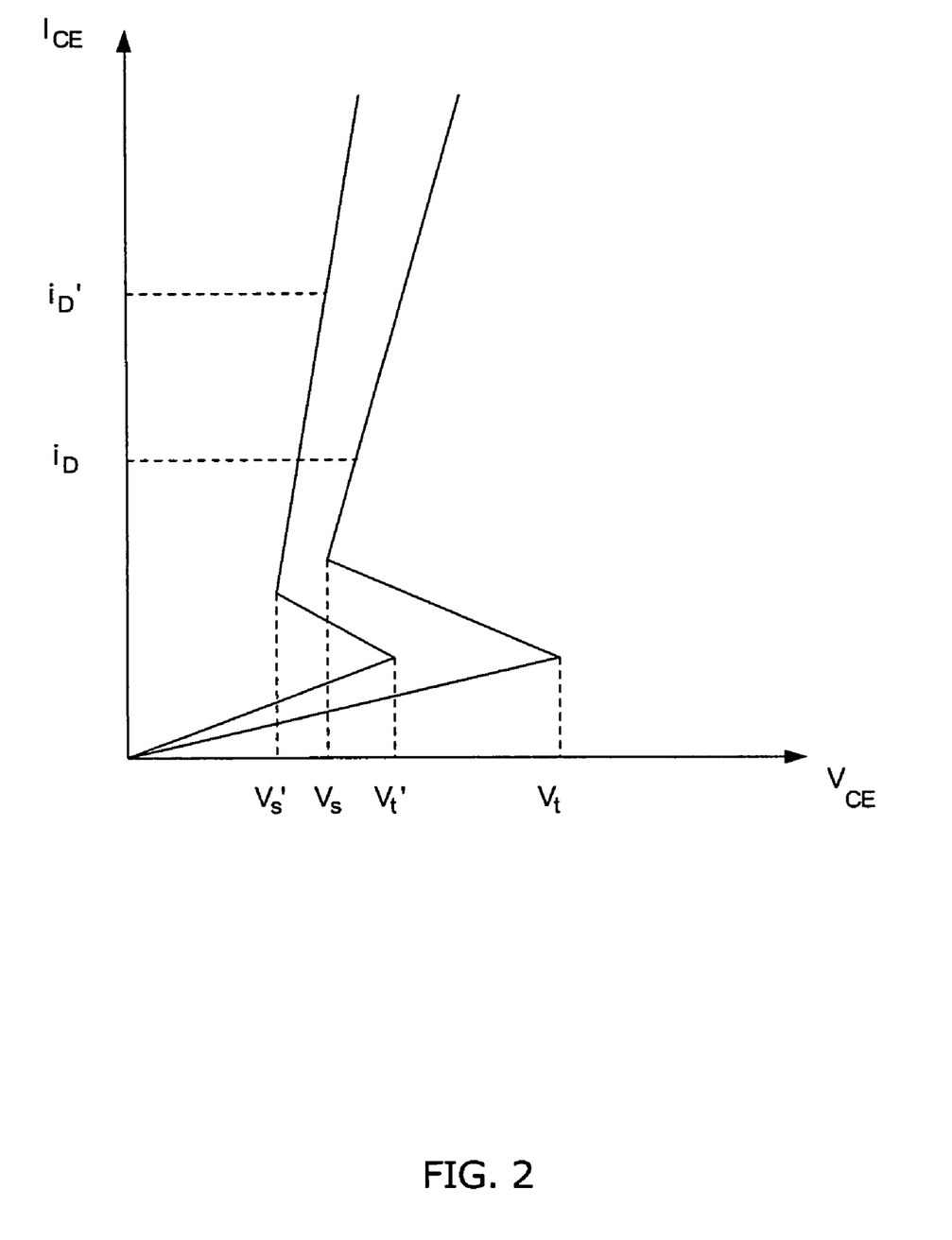
FIG. 2 illustrates a current-voltage graph in accordance with one example of the present disclosure.

FIG. 2 presents a current-voltage graph that illustrates the benefit of the positive triggering base current from pad 102 in the case of a positive ESD. The vertical axis, $I_{ce}$, is the collector-to-emitter current of the bipolar transistor 150, whereas the horizontal axis, $V_{ce}$, is the collector-to-emitter voltage. The triggering base current arrives from pad 102, through diodes 138, 140 and 142 to the node 144 and the body 146 of NMOSFET 108. The body 146 of NMOSFET 108 is also the base of bipolar transistor 150. The dissipation current, or Id, that is the triggering base current multiplied by beta, is higher than a dissipation current that is attained in a conventional design without the diode string triggering. Therefore, the triggering base current drives the bipolar transistor 150 hard enough such that the threshold voltage is lowered from Vt to Vt', while the snapback voltage is lowered from Vs to Vs', thereby allowing a more efficient dissipation of the ESD charge.

Figure 3A:
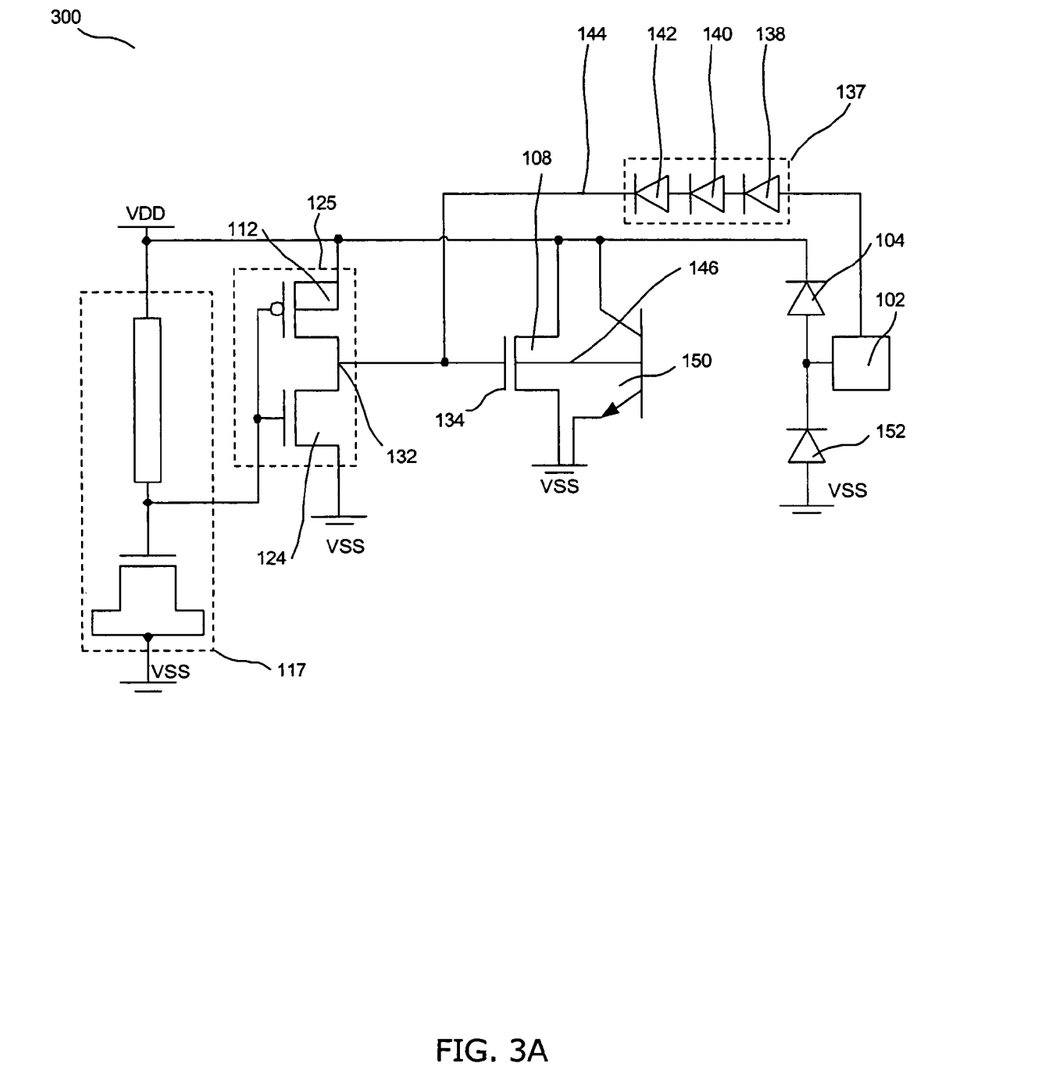
FIG. 3A illustrates an electrostatic discharge protection circuitry in accordance with a second example of the present disclosure.

In a second example as illustrated in FIG. 3A, the ESD protection circuitry is constructed of the same components as in FIG. 1A. However, in FIG. 3A, the diode string 137 from the bondpad or pad 102 is connected to node 132 at the gate 134 of NMOSFET 108, instead of to the body 146 of NMOSFET 108. Current through the diode string 137 that results from a positive ESD is not available to drive bipolar transistor 150. Instead, the positive ESD charge at pad 102 drives a current through the diode string 137 to charge the capacitance of the gate 134 of NMOSFET 108. Once NMOSFET 108 is turned on, the ESD charge will dissipate through NMOSFET 108 to VSS. Concurrently, positive charge at the gate 134 of NMOSFET 108 will induce a hole current into the body 146, thereby causing a gate current which triggers a much larger current $I_{ce}$ through the collector and emitter of the bipolar transistor 150, thereby further dissipating the ESD charge. Therefore, the ESD charge dissipates from pad 102 through diode 104 and through a combination of NMOSFET 108 and bipolar transistor 150 to VSS, which may further be grounded as shown in FIG. 1B.

When a negative ESD arrives at pad 102, the negative voltage can only build up to the forward voltage drop across diode 152. The operation is the same as in the first example. Negative static charge is dissipated at this low voltage to ground VSS through diode 152. The core circuitry of the IC is thus easily protected. The ESD charge dissipates from pad 102 through diode 152 to ground VSS.

Although the positive triggering current from pad 102 is connected to the node 132 at the gate 134 of NMOSFET 108, there is still a benefit of lowering both the threshold voltage and the snapback voltage because gate 134 is still now driven harder. This effect is similar to the situation as illustrated in FIG. 2.

Figure 3B:
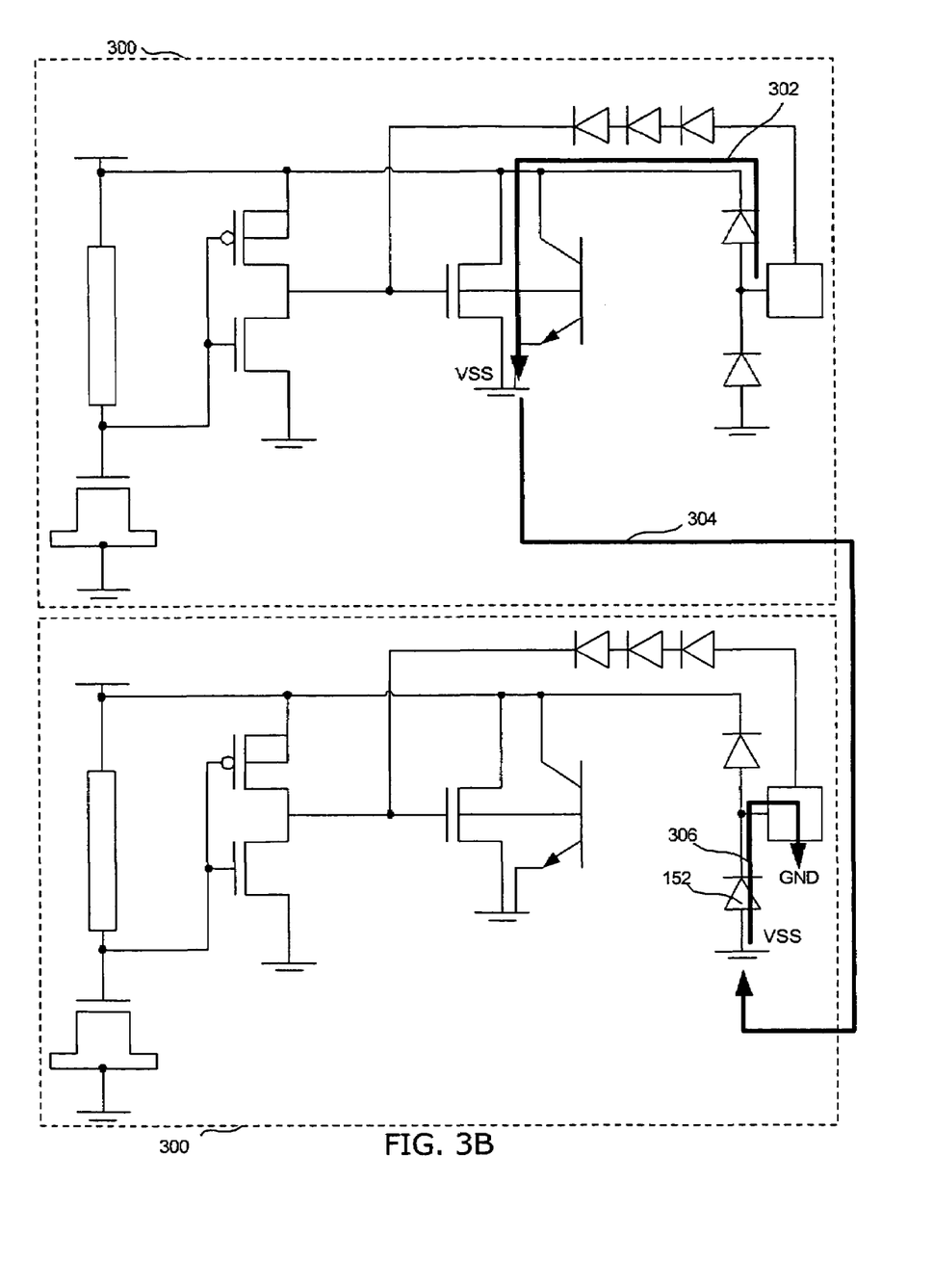
FIG. 3B illustrates an example of electric current pathway in accordance with the second example of the present disclosure.

FIG. 3B illustrates an electric current pathway when a positive ESD arrives at the pad 102 in accordance with the second example of the present disclosure. With reference to both FIGS. 3A and 3B, FIG. 3B includes two ESD protection circuits 300, the top circuit of which is zapped by a positive ESD. The pad of the bottom circuit is connected to ground. If the pad of the top circuit is not connected to ground, the ESD charge is first dissipated to a VSS connection of the top circuit, as represented by a pathway 302. Since the VSS connection of the top circuit is commonly connected, as represented by a common connection 304, to a VSS connection of the bottom circuit, whose pad is connected to ground, the ESD charge will travel from the VSS of the top circuit to the VSS of the bottom circuit. The ESD charge then travels through a pathway 306 via the diode 152 before it is finally dissipated to ground.

The above disclosure provides many different embodiments, or examples, for implementing different features of the invention. Specific examples of components, and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. An electrostatic discharge (ESD) protection circuit for preventing a pad-to-pad ESD charge, the protection circuit for each pad of an integrated circuit comprising:
    a current dissipation module with an N-type MOSFET connected in parallel with a bipolar junction transistor (BJT) wherein the drain of the MOSFET and the collector of the BJT are connected to a first common node and the source of the MOSFET and the emitter of the BJT are connected to a second common node connectable to a second operating voltage;
    a diode string connected to a first pad at its anode end having a total forward voltage drop more than a first operating voltage and with its cathode end connected to the body of the MOSFET, the base of the BJT, and to the second common node through a resistor;
    a first diode with its anode end connected to the first pad and its cathode end connected to the first common node; and
    a second diode with its anode end connected to the second common node and its cathode node connected to the first pad,
    wherein when the ESD charge causes a voltage on the first pad to surpass the total forward voltage drop of the diode string, the ESD charge injects a direct current to the base of the BJT so as to enhance the dissipation of the ESD charge and wherein the diode string keeps the voltage on the first pad between the first and second operating voltages.

2. The circuit of claim 1 further comprising:
    an inverter module for controlling the MOSFET; and
    an RC module providing an input voltage to the inverter module and connected to the inverter at the first common node that is connectable to the first operating voltage,
    wherein when the ESD charge arrives at the pad, the first diode passes a current to charge the first common node so that the RC module and the inverter turn on the MOSFET for dissipating the ESD charge.

3. The circuit of claim 1 wherein a threshold voltage for turning on the BJT is reduced and a turn-on current is increased due to the direct current injected into the base of the BJT.

4. The circuit of claim 1 wherein the BJT is of an npn type.

5. The circuit of claim 1 wherein the ESD charge on the first pad is dissipated through the second common node via the second diode of a second pad to the second pad which is connected to ground.

6. An electrostatic discharge protection circuit for a pad of an integrated circuit, the protection circuit comprising:
    an inverter module;

an RC module providing an input voltage to the inverter module and connected to the inverter at a first common node that is connectable to a first operating voltage;

a current dissipation module with a N-type MOSFET connected in parallel with a bipolar junction transistor (BJT) with the MOSFET's drain and the BJT's collector sharing the first common node with the inverter module and the RC module, the MOSFET's source and the BJT's emitter being connected to a second common node connectable to a second operating voltage, the MOSFET being controlled by the inverter;

a diode string connected to a pad at its anode end having a total forward voltage drop more than the first operating voltage and with its cathode end connected to the body of the MOSFET, the base of the BJT, and to the second common node through a resistor;

a first diode with its anode end connected to the pad and its cathode end connected to the first common node; and a second diode with its anode end connected to the second common node and its cathode node connected to the pad, wherein when an ESD charge arrives at the pad, the first diode passes a current to charge the first common node so that the RC module and the inverter turn on the MOSFET for dissipating the ESD charge, and wherein when the ESD charge causes a voltage on the pad to surpass the total forward voltage drop of the diode string, the BJT and the resistor join the MOSFET for dissipating the ESD charge, thereby keeping the voltage on the pad between the first and second operating voltages.

7. A method for dissipating an electrostatic discharge (ESD) charge on one or more pads of an integrated circuit, each pad being protected by an ESD protection circuit having an RC module providing an input voltage to an inverter module and connected to the inverter at a first common node that is connectable to a first operating voltage, a current dissipation module with a N-type MOSFET connected in parallel with a bipolar junction transistor (BJT) with the MOSFET's drain and the BJT's collector sharing the first common node with the inverter module and the RC module and with the MOSFET's source and the BJT's emitter being connected to a second common node connectable to a second operating voltage, a diode string connected to a pad at its anode end having a total forward voltage drop more than the first operating voltage and with its cathode end connected to the body of the MOSFET, the base of the BJT, and to the second common node through a resistor, the method comprising:

passing a current through a first diode to charge the first common node when an ESD charge arrives on the pad;

turning on the inverter by the RC module;

turning on the MOSFET by the inverter for dissipating the ESD charge; and turning on the BJT for dissipating the ESD charge when the ESD charge causes a voltage on the pad to surpass the total forward voltage drop of the diode string.

8. An electrostatic discharge (ESD) protection circuit for preventing a pad-to-pad ESD charge, the protection circuit for each pad of an integrated circuit comprising:

a current dissipation module with an N-type MOSFET connected in parallel with a bipolar junction transistor (BJT) wherein the drain of the MOSFET and the collector of the BJT are connected to a first common node and the source of the MOSFET, the emitter of the BJT are connected to a second common node connectable to a second operating voltage, and the body of the MOSFET is connected to the base gate of the BJT;

a diode string connected to a first pad at its anode end having a total forward voltage drop more than a first operating voltage and with its cathode end connected to the gate of the MOSFET;

a first diode with its anode end connected to the first pad and its cathode end connected to the first common node; and a second diode with its anode end connected to the second common node and its cathode node connected to the first pad, wherein when the ESD charge causes a voltage on the first pad to surpass the total forward voltage drop of the diode string, the ESD charge injects a direct current to the gate of the MOSFET for dissipating the ESD charge through the MOSFET and for causing a base current of the BJT so as to enhance the dissipation of the ESD charge by using the BJT and wherein the diode string keeps the voltage on the first pad between the first and second operating voltages.

9. The circuit of claim 8 further comprising:

an inverter module for controlling the MOSFET; and an RC module providing an input voltage to the inverter module and connected to the inverter at the first common node that is connectable to the first operating voltage, wherein when the ESD charge arrives at the pad, the first diode passes a current to charge the first common node so that the RC module and the inverter contributes to the control of the MOSFET for dissipating the ESD charge.

10. The circuit of claim 8 wherein a threshold voltage for turning on the BJT is reduced and a turn-on current is increased due to the base current caused by the ESD charge.

11. The circuit of claim 8 wherein the BJT is of an npn type.

12. The circuit of claim 8 wherein the ESD charge on the first pad is dissipated through the second common node via the second diode of a second pad to the second pad which is connected to ground.

13. An electrostatic discharge protection circuit for a pad of an integrated circuit, the protection circuit comprising:

an inverter module;

an RC module providing an input voltage to the inverter module and connected to the inverter at a first common node that is connectable to a first operating voltage;

a current dissipation module with a N-type MOSFET connected in parallel with a bipolar junction transistor (BJT) with the MOSFET's drain and the BJT's collector sharing the first common node with the inverter module and the RC module, the MOSFET's source and the BJT's emitter being connected to a second common node connectable to a second operating voltage, the MOSFET's body being connected to the base of the BJT, and the MOSFET being controlled by the inverter;

a diode string connected to a pad at its anode end having a total forward voltage drop more than the first operating voltage and with its cathode end connected to the gate of the MOSFET;

a first diode with its anode end connected to the pad and its cathode end connected to the first common node; and a second diode with its anode end connected to the second common node and its cathode node connected to the pad, wherein when an ESD charge arrives at the pad, the first diode passes a current to charge the first common node so that the RC module and the inverter turn on the MOSFET for dissipating the ESD charge, and wherein when the ESD charge causes a voltage on the pad to surpass the total forward voltage drop of the diode string, a current caused by the ESD charge triggers the BJT to join the MOSFET for dissipating the ESD charge, thereby keeping the voltage on the pad between the first and second operating voltages.

14. A method for dissipating an electrostatic discharge (ESD) charge on one or more pads of an integrated circuit, each pad being protected by an ESD protection circuit having a current dissipation module with a N-type MOSFET connected in parallel with a bipolar junction transistor (BJT) with the MOSFET's drain and the BJT's collector sharing a first common node, with the MOSFET's source and the BJT's emitter connected to a second common node connectable to a second operating voltage, and with a gate of the BJT connected to a body of the MOSFET, a diode string connected to a pad at its anode end having a total forward voltage drop more than the first operating voltage and with its cathode end connected to the gate of the MOSFET, the method comprising:

passing a current through a first diode to charge the first common node when an ESD charge arrives on the pad;

turning on the MOSFET for dissipating the ESD charge when the ESD charge causes a voltage on the pad to surpass the total forward voltage drop of the diode string; and turning on the BJT by a base current caused by the ESD charge imposed on the gate of the MOSFET for further dissipating the ESD charge.

15. The method of claim 14 further comprising:

turning on the inverter by the RC module; and turning on the MOSFET by the inverter for dissipating the ESD charge.

* * * * *

UNITED STATES PATENT AND TRADEMARK OFFICE
CERTIFICATE OF CORRECTION

PATENT NO. : 6,963,112 B2  
APPLICATION NO. : 10/754770  
DATED : November 8, 2005  
INVENTOR(S) : Chung-Hui Cheng

Page 1 of 1

It is certified that error appears in the above-identified patent and that said Letters Patent is hereby corrected as shown below:

Column 8, claim 8, line 2, delete "gate"

Signed and Sealed this

Thirteenth Day of March, 2007

JON W. DUDAS  
*Director of the United States Patent and Trademark Office*